United States Patent
Froemel

(10) Patent No.: US 9,338,550 B2
(45) Date of Patent: May 10, 2016

(54) MICROPHONE, A MICROPHONE ARRANGEMENT AND A METHOD FOR PROCESSING SIGNALS IN A MICROPHONE

(71) Applicant: Infineon Technologies AG, Neubiberg (DE)

(72) Inventor: Andreas Froemel, Ulm (DE)

(73) Assignee: Infineon Technologies AG, Neubiberg (DE)

( * ) Notice: Subject to any disclaimer, the term of this patent is extended or adjusted under 35 U.S.C. 154(b) by 278 days.

(21) Appl. No.: 13/975,069

(22) Filed: Aug. 23, 2013

(65) Prior Publication Data

US 2015/0055795 A1    Feb. 26, 2015

(51) Int. Cl.
*H04R 3/00* (2006.01)
*H04R 29/00* (2006.01)
*H03G 5/16* (2006.01)
*H03G 3/30* (2006.01)
*H03G 7/00* (2006.01)

(52) U.S. Cl.
CPC .............. *H04R 3/005* (2013.01); *H04R 29/004* (2013.01); *H03G 3/3005* (2013.01); *H03G 5/165* (2013.01); *H03G 7/002* (2013.01)

(58) Field of Classification Search
None
See application file for complete search history.

(56) References Cited

U.S. PATENT DOCUMENTS

2012/0039486 A1* 2/2012 Cheng ........................ 381/104
2014/0112501 A1* 4/2014 Yeh et al. ..................... 381/122

* cited by examiner

*Primary Examiner* — Regina N Holder
(74) *Attorney, Agent, or Firm* — Slater & Matsil, LLP

(57) ABSTRACT

A microphone includes a first signal input, a second signal input and a control unit coupled to the first signal input and the second signal input. The control unit is configured to, upon receiving a support signal at one of the first signal input and second signal input, process a signal received at the other of the first signal input and second signal input as an incoming data signal.

17 Claims, 5 Drawing Sheets

```
┌─────────────────────────────────────────────────────┐
│    Receiving at one of the first signal input       │─ 401
│    and second signal input a support signal.        │
└─────────────────────────────────────────────────────┘
                         │
                         ▼
┌─────────────────────────────────────────────────────┐
│   Upon receiving the support signal, processing     │
│   a signal at the other of the first signal input   │─ 403
│   and second signal input as an incoming data signal.│
└─────────────────────────────────────────────────────┘
                         │
                         ▼
┌─────────────────────────────────────────────────────┐
│      Varying at least one parameter of the          │─ 405
│      microphone based on the received data signal.  │
└─────────────────────────────────────────────────────┘
```

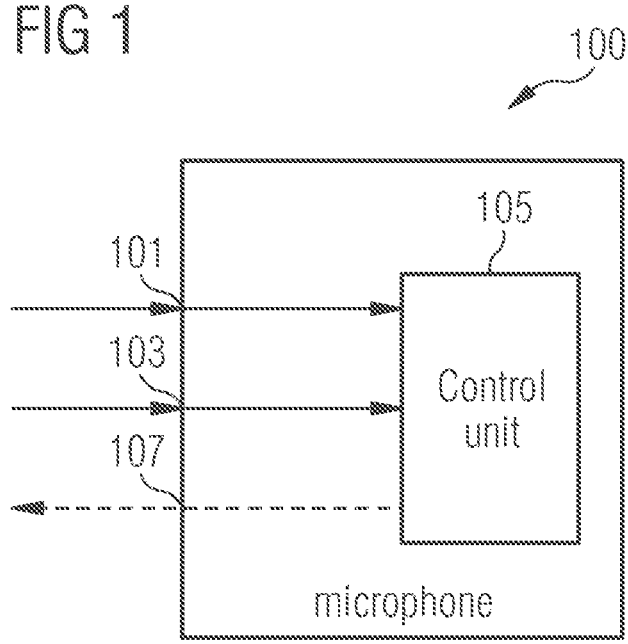

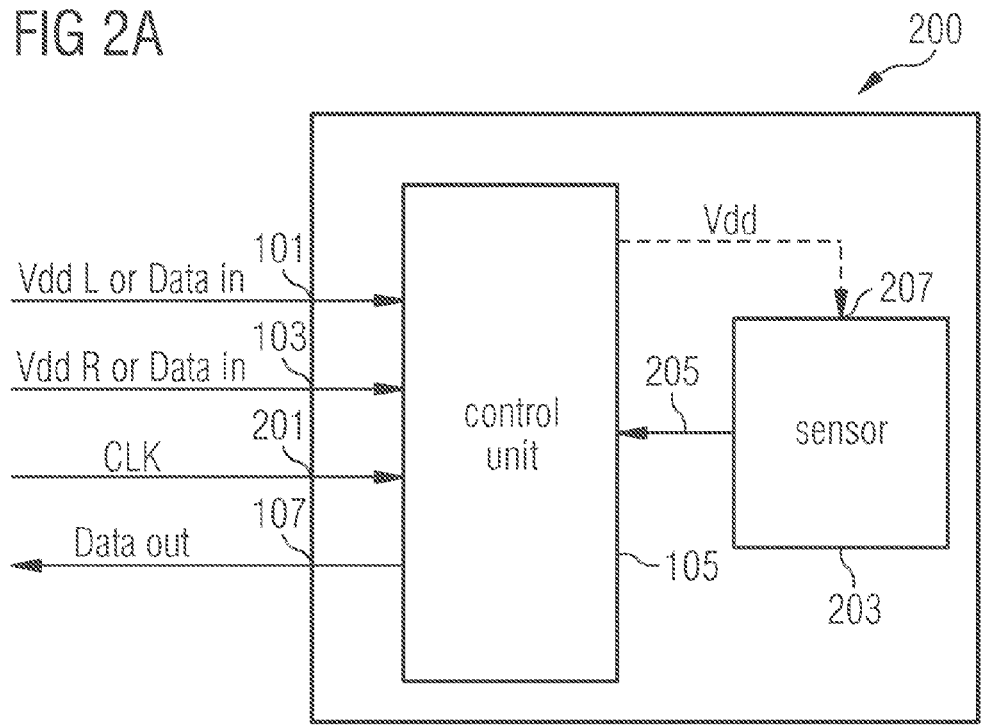
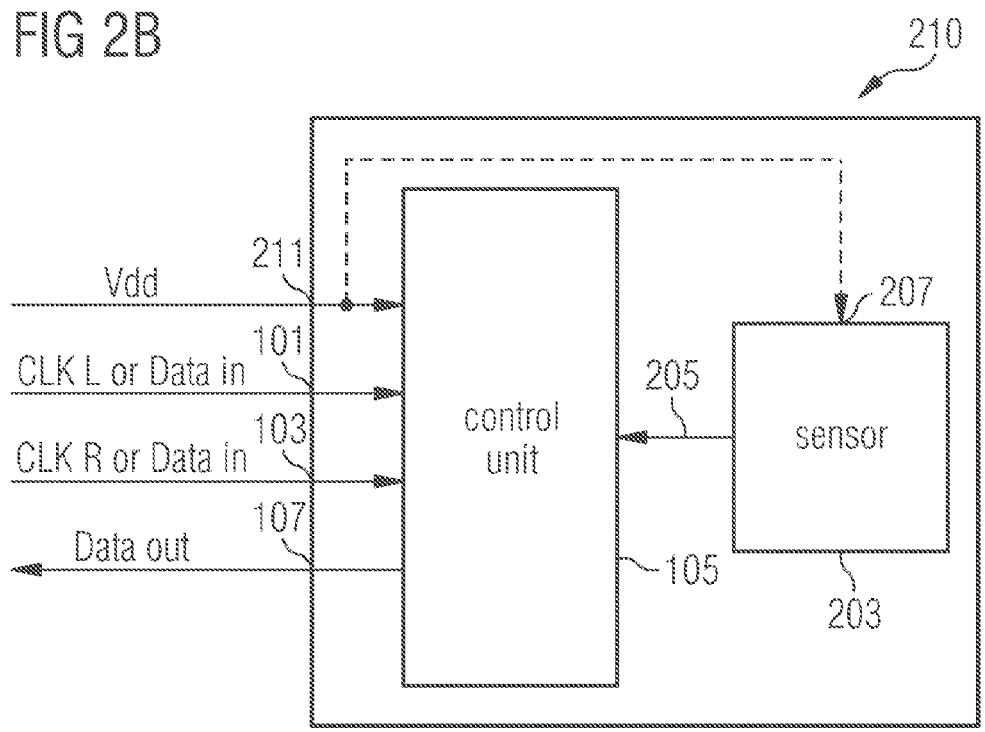

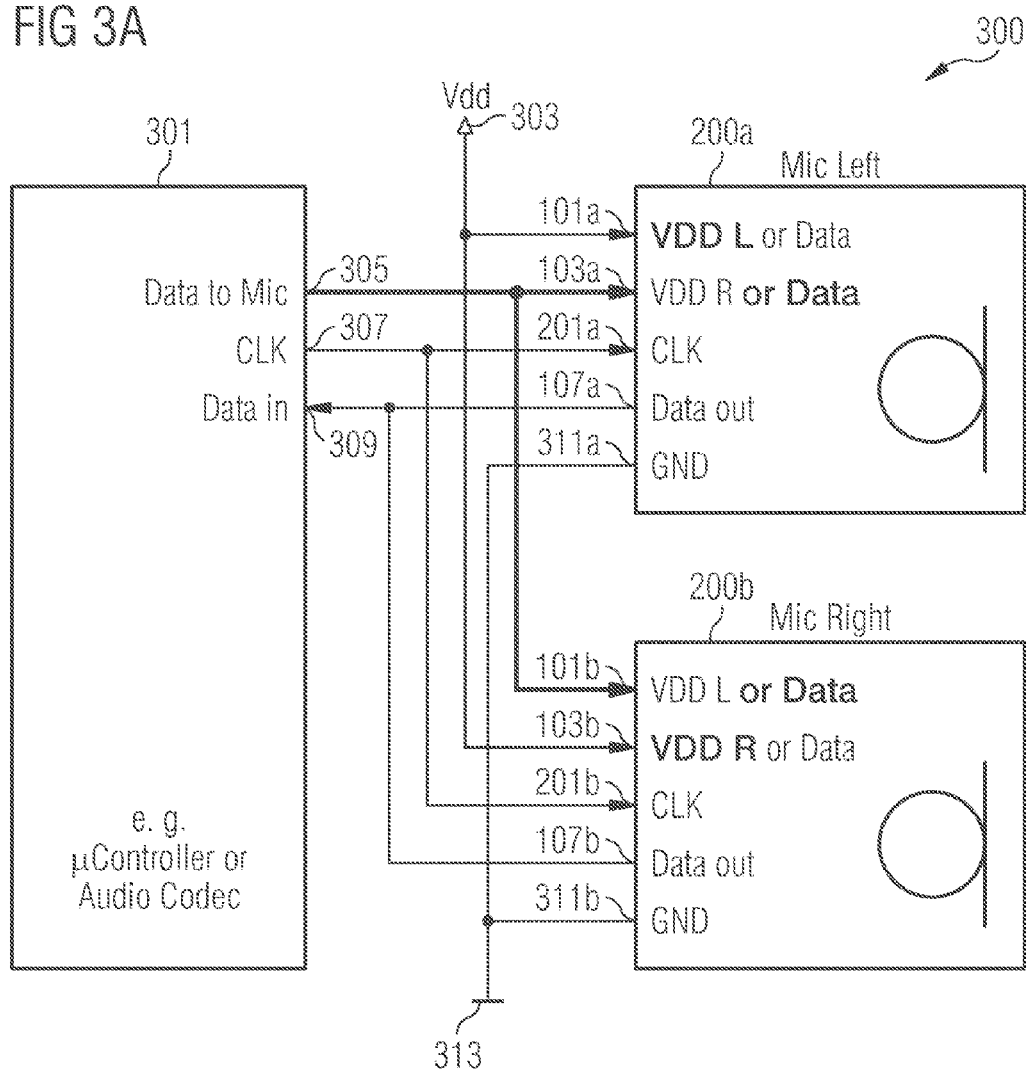

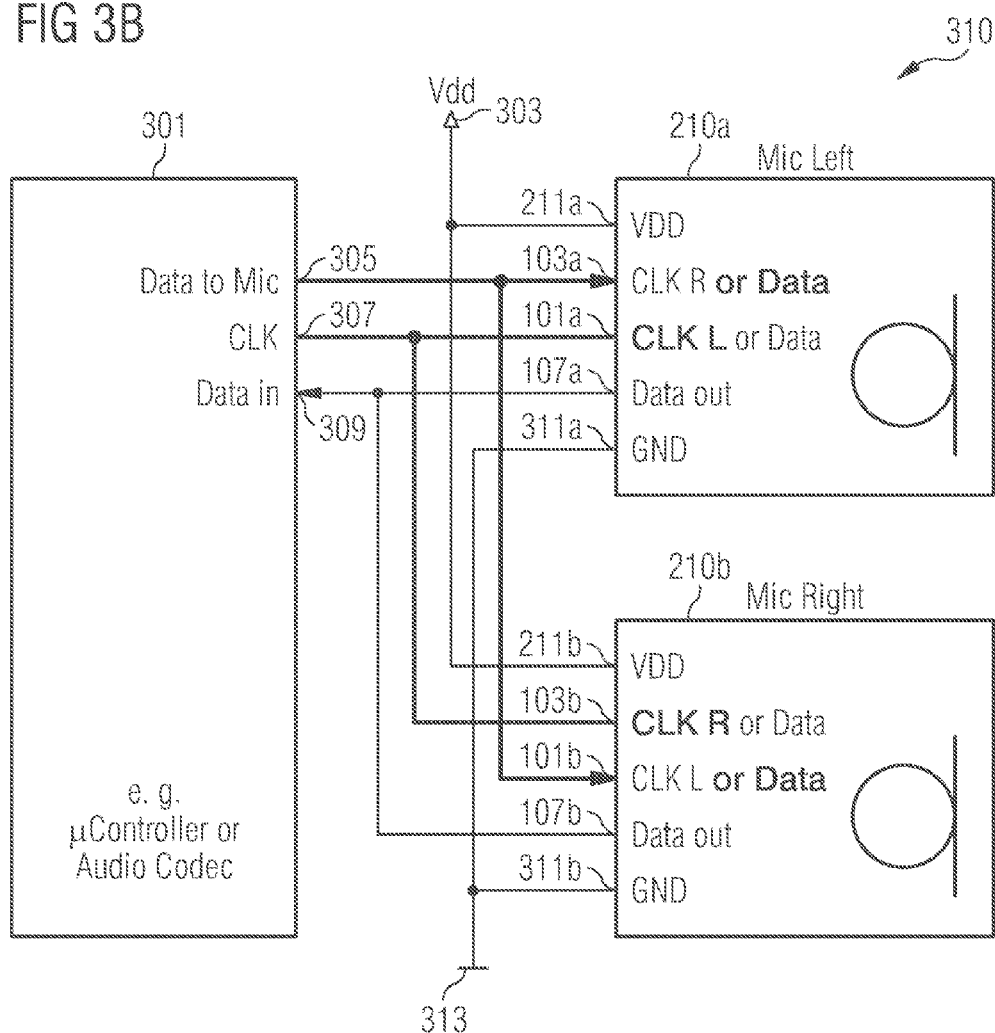

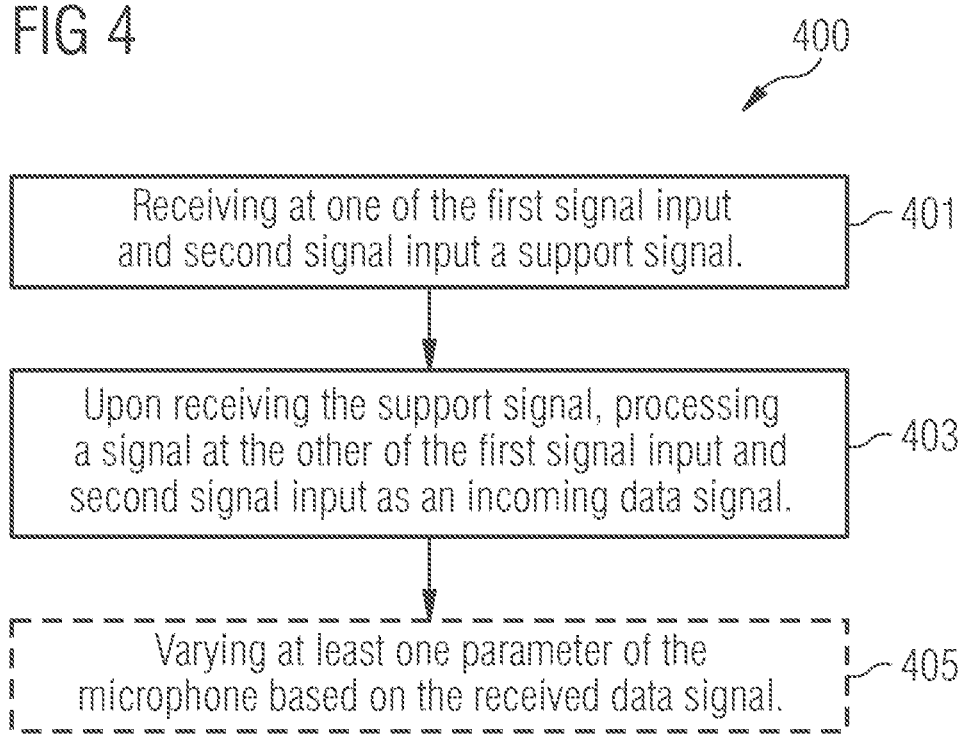

MICROPHONE, A MICROPHONE ARRANGEMENT AND A METHOD FOR PROCESSING SIGNALS IN A MICROPHONE

TECHNICAL FIELD

Embodiments of the present invention relate to a microphone. Further embodiments of the present invention relate to a microphone arrangement and a method for processing signals in a microphone.

BACKGROUND

Conventional microphones send a plain audio signal via a codec to a digital signal processor (DSP), for example, inside of a mobile device. The DSP controls the gain, the compression and the equalizer. Nevertheless, in case of high sound pressure an internal amplifier of the microphone starts to clip. Even the reduction of the gain on the side of the DSP will not reduce the clipping.

SUMMARY OF THE INVENTION

Embodiments of the present invention relate to a microphone. The microphone comprises a first signal input, a second signal input and a control unit coupled to the first signal input and the second signal input. The control unit is configured to, upon receiving a support signal at one of the first signal input and second signal input, process a signal received at the other of the first signal input and second signal input as an incoming data signal.

Further embodiments of the present invention relate to microphone arrangements comprising two of such microphones and a central control unit.

Further embodiments of the present invention relate to a method for controlling a microphone.

BRIEF DESCRIPTION OF THE DRAWINGS

Embodiments of the present invention will be described in the following using the accompanying figures, in which:

FIG. 1 shows a block schematic diagram of a microphone according to an embodiment of the present invention;

FIG. 2a shows a block schematic diagram of a first exemplary implementation of the microphone shown in FIG. 1 combining VDD inputs with data inputs;

FIG. 2b shows a block schematic diagram of a second exemplary implementation of the microphone shown in FIG. 1 combining clock inputs with data inputs;

FIG. 3a shows a block schematic diagram of a microphone arrangement comprising two of the microphones shown in FIG. 2a according to an embodiment of the present invention;

FIG. 3b shows a block schematic diagram of a microphone arrangement comprising two of the microphones shown in FIG. 2b according to a further embodiment of the present invention; and FIG. 4 shows a flow chart of a method according to an embodiment of the present invention.

Before in the following embodiments of the present invention are described in more detail using the accompanying figures, it is to be pointed out that in the figures same or functionally equivalent elements are provided with the same reference numbers. Hence, descriptions provided for elements having the same reference numbers are mutually exchangeable.

DETAILED DESCRIPTION OF ILLUSTRATIVE EMBODIMENTS

FIG. 1 shows a block schematic diagram of a microphone 100 according to an embodiment of the present invention.

The microphone 100 comprises a first signal input 101 and a second signal input 103. Furthermore, the microphone 100 comprises a control unit 105. The control unit 105 is coupled to the first signal input 101 and to the second signal input 103. The control unit 105 is configured to, upon receiving a support signal at one of the first signal input 101 and the second signal input 103, process a (further) signal received at the other of the first signal input 101 and the second signal input 103 as an incoming data signal. In other words, the control unit 105 is configured to, upon receiving the support signal at the first signal input 101 process a signal received at the second signal input 103 as a data signal and to, upon receiving the support signal at the second signal input 103 process a signal received at the first signal input 101 as a data signal.

Hence, it can be seen that the signal inputs 101, 103 form combined signal inputs of the microphone 100 which can be used on the one hand for receiving a support signal and on the other hand for receiving a data signal. The control unit 105 in the microphone 100 decides itself if a signal received at the first signal input 101 and the second signal input 103 is a support signal or a data signal and processes the received signals accordingly. A support signal may be, for example, a supply voltage signal for supplying the microphone 100 with energy or may also be a clock signal. Based on such a clock signal, the microphone 100 may be configured to provide a microphone output signal.

It has been found by the inventors that it is advantageous to have the possibility to transfer data to the microphone 100 (which may be a digital microphone). By having the possibility of transferring data to the microphone 100 parameters in the microphone 100 can be set. Such parameters may be a gain of an internal amplifier of the microphone 100, parameters or settings of a compressor and/or a limiter in the microphone 100, parameters or settings of an equalizer of the microphone 100 and even parameters for activating and deactivating low power modes of the microphone 100.

However, it has also been found by the inventors that every additional pin that has to be spent on a microphone increases the footprint of the microphone and therefore the costs for such a microphone. Hence, the inventors have found that it is advantageous to implement the microphone 100 such that it, on the one hand, can receive data from an external unit, but on the other hand does not have an increased footprint when compared to microphones which do not have the possibility of receiving data. In other words, the microphone 100 does not need additional pins when compared to a conventional microphone which does not have the capability of receiving data. The microphone 100 achieves this extra functionality of receiving data without having any additional pins by having the first signal input 101 and the second signal input 103 each being capable of receiving both a support signal and a data signal and by furthermore having the control unit 105 being configured to switch the first signal input 101 and the second signal input 103 between being a support signal input and a data signal input (or in short data input).

Furthermore, based on at which of the signal inputs 101, 103 the microphone 100 received the support signal, the control unit 105 is configured to determine whether the microphone 100 is a left channel microphone or a right channel microphone and can accordingly process signals received from an external unit or signals transmitted to such external unit.

As an example, if the support signal is received at the first signal input 101 the control unit 105 determines the microphone being a left channel microphone and interprets signals received at the second signal input 103 as data signals. But, if the support signal is received at the second signal input 103 of the microphone 100, the control unit 105 determines the microphone being a right channel microphone and interprets further signals received at the first signal input 101 as data signals. Hence, depending on which of the first signal input 101 and the second signal input 103 of the microphone 100 the support signal was received, the control unit 105 determines whether the microphone 100 is configured as a left channel microphone or a right channel microphone.

Furthermore, the control unit 105 is configured to vary a microphone property in dependence on the received data signal. Such a microphone property can be (as already described in the foregoing) at least one of a gain of an amplifier of the microphone, a compressor setting, a limiter setting, an equalizer setting or even a low power mode setting.

To summarize, the microphone 100 provides the possibility to send data (e.g., digital data) to the microphone 100 to change a gain, a compression, an equalizing, etc. without adding extra pins when compared to a conventional microphone.

Furthermore, the microphone 100 can comprise a data output 107 for providing a microphone output signal. The microphone output signal can be a digital signal which is provided by the control unit 105. The control unit 105 can be further configured to vary a timing of the microphone output signal provided at the data output 107 depending on at which of the first signal input 101 and the second signal input 103 the support signal was received. As an example, if the support signal was received at the first signal input 101 (e.g., determining the microphone 100 as a left channel microphone) a first timing may be used by the control unit 105 for providing the microphone output signal. When the support signal is received at the second signal input 103 (e.g., determining the microphone 100 being a right channel microphone) a second timing may be used for providing the microphone output signal (which is different from the first timing).

As an example, the control unit 105 may be configured to receive a clock signal (from an external unit) and to, if the support signal was received at the first signal input 101, update the microphone update signal with a first type of edge of the clock signal (such as rising edge or falling edge) and if the support signal was received at the second signal input 103 of the microphone 100 update the microphone output signal with a second type of edge of the clock signal, e.g., falling edge or rising edge (which is inverse or contrary to the first type of edge). In other words, the control unit 105 is configured to vary the providing of the microphone output signal at the data output 107 in dependence on at which of the first signal input 103 and the second signal input 103 it received the support signal.

The clock signal may be received at one of the signal inputs 101, 103 (as the support signal) or at an additional pin of the microphone 100. A more detailed example for the case in which the clock signal is received as the support signal is given in FIG. 2b, and for the case in which the clock signal is received at an extra pin of the microphone 100 is given in FIG. 2a.

Furthermore, the control unit 105 can be configured to, if the support signal was received at the first signal input 101 set the data output 107 to a floating state with the second type of edge of the clock signal and, and if the support signal was received at the second signal input 103 set the data output 107 to the floating state with the first type of edge of the clock signal.

Furthermore, for determining if the signal received at the first signal input 101 or the second signal input 103 is a support signal or a data signal, the control unit 105 can be configured to identify the one signal input of the first signal input 101 and the second signal input 103 as the support signal input (at which the support signal is applied or will be received) at which the first signal edge is applied (e.g., after a reset of the microphone 100 or after a power-on of the microphone 100). In other words, the signal input of the first signal input 101 and the second signal input 103 at which a first signal edge occurs is treated by the control unit 105 as the support signal input at which the support signal is received, while the other of the first signal input 101 and the second signal input 103 is treated as the data signal input at which the data signal is received. Hence, an external unit or controller which is connected to the first signal input 101 and the second signal input 103 only has to take care that the first signal edge is applied to this one of the first signal input 101 and the second signal input 103 which shall be treated as the support signal input of the microphone 100 without the need for an extra signalization.

Furthermore, the control unit 105 is configured to identify further signal edges (which are received after the first signal edge) at the support signal input as signal edges of the support signal (such as a supply voltage signal or a clock signal).

Furthermore, the control unit 105 is configured to identify signal edges at the other signal input of the first signal input 101 and the second signal input 103 (which is not the support signal input) as signal edges of the data signal. The control unit 105 can be typically configured to maintain this association of the support signal input and the data signal input to the signal inputs 101, 103 until a reset of the microphone 100. Hence, after a reset of the microphone 100 has occurred, the control unit 105 may again interpret the first signal edge received at one of the first signal input 101 and the second signal input 103 as a support signal edge and may, therefore, treat accordingly the signal input of the first signal input 101 and the second signal input 103 as the support signal input at which this signal edge occurred.

In the following, two exemplary implementations of the microphone 100 will be described in conjunction with FIGS. 2a and 2b. The implementation in FIG. 2a is based on the idea that the VDD and channel select inputs of the microphone 100 are combined with the data signal input. The implementation in FIG. 2b is based on the idea that the clock and channel select inputs of the microphone 100 are combined with the data signal input.

The microphone 200 shown in FIG. 2a comprises the control unit 105 and the first signal input 101 and the second signal input 103. Furthermore, the microphone 200 comprises a clock input 201. Furthermore, the microphone 200 comprises the data output 107.

Furthermore, the microphone 200 comprises a microphone sensor (such as a MEMS sensor) 203. The sensor 203 is configured to provide microphone raw data 205 to the control unit 105. The control unit 105 is configured to provide, based on the microphone raw data 205, a microphone output signal (in a digital form) at the data output 107.

As can be seen from FIG. 2a, the microphone 200 is based on the idea to combine the supply voltage signal VDD and a channel select signal for supplying the microphone 200 with energy, for selecting the channel of the microphone 200 and for transferring control data to the microphone 200.

In other words, in the concept shown in FIG. 2a the support signal is a supply voltage signal VDD for supplying the microphone 200 with energy. The control unit 105 is therefore configured to receive the support signal being a supply voltage signal VDD for supplying the microphone 200 with power. Hence, when the support signal (as the supply voltage signal) is received at the first signal input 101, the first signal input 101 forms the supply voltage input of the microphone 200, while the second signal input 103 of the microphone 200 forms the data signal input. On the other hand, when the support signal (in the form of the supply voltage signal VDD) is received at the second signal input 103, the second signal input 103 forms the supply voltage input of the microphone 200 and the first signal input 101 forms the data signal input of the microphone 200. In other words, the signal input at which of the first signal input 101 and the second signal input 103 the supply voltage signal is received forms the supply voltage input of the microphone 200 and the other signal input of the first signal input 101 and the second signal input 103 forms the data signal input of the microphone 200.

Furthermore, the signal inputs 101, 103 are also used to determine if the microphone 200 is a left channel microphone or a right channel microphone. As can be seen from FIG. 2a, in the case in which the supply voltage signal is applied to the first signal input 101, the microphone 200 is treated as a left channel microphone while in the case in which the supply voltage signal is supplied to the second signal input 103 the microphone 200 is treated as a right channel microphone.

In other words, by putting the first signal input 101 or the second signal input 103 to VDD one can select whether the microphone 100 is a left channel microphone or a right channel microphone. Then, the other pin or other signal input 101, 103 can be used to send parameters, for example, for gain, equalizer, compression, etc. to the microphone 200.

It can be seen that no extra pin is needed for the microphone 200 when compared to conventional microphones without having the capability of providing data to the microphones. Furthermore, only one single output pin is sufficient at an external unit (such as at a microcontroller) to control the microphone settings of the microphone 200.

To summarize, the signal inputs 101, 103 have the combined function of being a supply voltage input, a channel select input and a data signal input.

In dependence on the selected channel of the microphone 200 (left channel or right channel) the control unit 105 provides the microphone output signal 107. As an example, if the supply voltage signal is provided at the first signal input 101 the microphone 200 may be determined as a left channel microphone. In this case, the control unit 105 may be configured to update the microphone output signal at the data output 107 for every edge of the incoming clock signal received at the clock input 201 being from a first type of edge (out of rising edge and falling edge). For the other case, in which the supply voltage signal is provided at the second signal input 103, the control unit 105 may be configured to update the microphone output signal provided at the data output 107 for every edge from a second type of edge (out of falling edge and rising edge) of the clock signal received at the clock input 201. Hence, it can be ensured that when a first microphone which is configured as a right channel microphone and a second microphone which is configured as a left channel microphone and which are connected to the same data output line, the two microphone update their microphone output signals time multiplexed (with different edges of the clock signal received at their clock inputs 201).

Furthermore, the control unit 105 can be configured to evaluate the received data signals from the first signal input 101 or the second signal input 103 based on the clock signal received at the clock input 201 (e.g., only at certain edges of the clock signal received at the clock input 201).

Furthermore, the control unit 105 can be configured to supply the sensor 203 with the supply voltage received either at the first signal input 101 or the second signal input 103. Hence, the control unit 105 can be configured to couple a supply voltage input 207 of the sensor 203 to the signal input of the first signal input 101 and the second signal input 103 at which it received the support signal in the form of the supply voltage signal.

FIG. 2b shows a microphone 210 which is a further exemplary implementation of the microphone 100 and which is based on the idea of combining clock inputs and channel select inputs with a data signal input.

Hence, in contrast to the implementation of FIG. 2a, in the implementation of FIG. 2b the microphone 210 is configured to receive at the signal inputs 101, 103 the clock signal as the support signal (and not the supply voltage signal). Hence, the microphone 210 comprises, when compared to the microphone 200 in FIG. 2a, an additional supply voltage input 211 at which the supply voltage VDD can be applied. Furthermore, the microphone 210 comprises a control unit 105, the sensor 203, the first signal input 101, the second signal input 103 and the data signal output 107. The control unit 105 is configured to receive the support signal being a clock signal, such that the signal input of the first signal input 101 and the second signal input 103 at which the support signal is received forms the clock input of the microphone and the other signal input (at which the support signal is not received) forms the data signal input of the microphone 210.

Hence, if the clock signal is received at the first signal input 101, the first signal input 101 forms the clock input of the microphone 210 and the second signal input 103 forms the data signal input of the microphone 210. On the other hand, if the clock signal is received at the second signal input 103, the second signal input 103 forms the clock input of the microphone 210 and the first signal input 101 forms the data signal input of the microphone 210.

Furthermore, the signal inputs 101, 103 are used for controlling if the microphone 210 is a left channel microphone or a right channel microphone. As can be seen in FIG. 2b, if the clock signal is received at the first signal input 101 the microphone 210 is treated as a left channel microphone and if the clock signal is received at the second signal input 103 the microphone 210 is treated as a right channel microphone.

As already described in conjunction with FIG. 2a, the control unit 105 updates the microphone output signal provided at the data output 107 in dependence of the microphone 210 being configured as a left channel microphone or a right channel microphone. Hence, if the clock signal is applied to the first signal input 101 and the microphone 210 is treated as a left channel microphone the control unit 105 updates the microphone output signal with every edge of a first type of edge of the clock signal. If the clock signal is received at the second signal input 103 and the microphone 210 is treated as a right channel microphone, the microphone output signal is updated with every edge of a second type of edge of the clock signal.

Furthermore, as can be seen in FIG. 2b the supply voltage input 207 of the sensor 203 can be directly connected to the supply voltage input 211 of the microphone 210 (without having the control unit 105 in between).

FIG. 3a shows a microphone arrangement 300 according to an embodiment of the present invention. The microphone arrangement 300 comprises a first microphone 200a and a second microphone 200b. The first microphone 200a and the second microphone 200b are each identical to the microphone 200 shown in FIG. 2a. The first microphone 200a and its elements is given the appendix a while the second microphone 200b and its elements is given the appendix b to distinguish the first microphone 200a and its elements from the second microphone 200b and its elements.

Nevertheless, the descriptions provided for the microphone 200 in conjunction with FIG. 2a apply to both the first microphone 200a and the second microphone 200b shown in FIG. 2a.

For the purpose of clarity the control unit and the sensor of the microphones 200a, 200b are not shown in FIG. 3a.

In addition to the first microphone 200a and the second microphone 200b the microphone arrangement comprises a central controller 301 and a supply voltage source 303 at which the supply voltage VDD is applied. As can be seen from FIG. 3a, the supply voltage source 303 is coupled to the first signal input 101a of the first microphone 200a and to the second signal input 103b of the second microphone 200b. Hence, in the case of the microphone arrangement 300 shown in FIG. 3a the first microphone 200a is treated as a left channel microphone, while the second microphone 200b is treated as a right channel microphone, because of the supply voltage being applied to the first signal input 101a of the first microphone 200a and to the second signal input 103b of the second microphone 200b. As the first signal input 101a of the first microphone 200a is the support signal input of the first microphone 200a, the second signal input 103a of the first microphone 200a forms the data signal input of the first microphone 200a. As the second signal input 103b of the second microphone 200b forms the support signal input of the second microphone 200b, the first signal input 101b of the second microphone 200b forms the data signal input of the second microphone 200b.

Hence, a data output 305 of the central controller 301, at which the central controller 301 provides a data output signal is coupled to the second signal input 103a of the first microphone 200a and to the first signal input 101b of the second microphone 200b. Furthermore, a clock output 307 of the central controller 301 at which the central controller 301 provides a clock signal is coupled to the clock input 201a of the first microphone 200a and the clock input 201b of the second microphone 200b.

Furthermore, a data signal input 309 of the central controller 301 at which the central controller receives the microphone output signals from the first microphone 200a and the second microphone 200b is coupled to the data output 107a of the first microphone 200a and the data output 107b of the second microphone 200b.

The central controller 301 is configured to provide parameters for adjusting the microphones 200a, 200b in the form of a data output signal provided at its data output 305 to the microphones 200a, 200b. The microphones 200a, 200b are configured to receive these parameters and to vary microphone properties in dependence on the received parameters, as already described above.

Furthermore, as can be seen from FIG. 3a, the microphones 200a, 200b each comprise a ground pin 311a, 311b for connecting to a ground terminal 313 of the microphone arrangement 300. The central controller 301 may comprise a microcontroller, a DSP or an audio codec, which receives and processes the microphone output signals provided from the microphones 200a, 200b.

As can be seen from FIG. 3a, the second signal input 103a of the first microphone 200a and the first signal input 101b of the second microphone 200b are coupled to the same data output terminal 305 of the central controller 301.

To summarize, the example shown in FIG. 3a by putting the first signal input 101a of the first microphone 200a to the supply voltage VDD the first microphone 200a is configured as a left channel microphone. By putting the second signal input 103b of the second microphone 200b to the supply voltage VDD the second microphone 200b is configured as a right channel microphone. The other signal inputs (the second signal input 103a of the first microphone 200a and the first signal input 101b of the second microphone 200b) are both coupled to the data output of the central controller 301 and function as data signal inputs for the microphones 200a, 200b.

In other words, by putting the VDDx or data pins (the signal input pins 101a, 103a, 101b, 103b) to VDD one can select whether the corresponding microphone 200a, 200b is left or right. Then one can use the other VDDx or data pin 101a, 103a, 101b, 103b to send parameters of the corresponding microphones 200a, 200b, for example, for gain, equalizer, compression, etc.

From FIG. 3a it can be clearly seen that when compared to conventional microphones no extra pin is needed and that only one output pin of the central controller 301 (the output pin 305) is sufficient to control the microphone parameters or microphone settings of both microphones 200a, 200b.

FIG. 3b shows a microphone arrangement 310 according to a further embodiment of the present invention. The microphone arrangement 310 shown in FIG. 3b differs from the microphone arrangement 300 shown in FIG. 3a in the fact that instead of the microphones 200a, 200b, which were identical to the microphone 200 shown in FIG. 2a, the microphone arrangement 310 comprises a first microphone 210a and a second microphone 210b which are identical to the microphone 210 shown in FIG. 2b.

For the reason of clarity and to better distinguish the first microphone 210a from the second microphone 210b the first microphone 210a and its elements are given the appendix a in the reference signs and the second microphone 210b and its elements are given the appendix b in the reference signs.

Nevertheless, the descriptions provided for the microphone 210 in conjunction with FIG. 2b apply to both the first microphone 210a and the second microphone 210b shown in FIG. 2b.

As can be seen from FIG. 3b, the supply voltage source 303 is coupled to the supply voltage terminals 211a, 211b of the microphones 210a, 210b.

Furthermore, the data output 305 of the central controller 301 is coupled to the second signal input 103a of the first microphone 210a and to the first signal input 101b of the second microphone 210b. The clock output of the central controller 301 is coupled to the first signal input 101a of the first microphone 210a and to the second signal input 103b of the second microphone 210b.

As already described in conjunction with FIG. 2b the control units of the microphones 210a, 210b are configured to receive the support signal as clock signal. Hence, in the example shown in FIG. 3b, the first signal input 101a of the first microphone 210a forms the support signal input and furthermore the clock signal input of the first microphone 210. In the second microphone 210b, the second signal input 103b forms the support signal input and the clock signal input of the second microphone 210b. Accordingly, the second signal input 103a of the first microphone 210a forms the data signal input of the first microphone 210a and the first signal input 101b of the second microphone 210b forms the data signal input of the second microphone 210b. As the support signal (the clock signal) is applied to the first signal input 101a of the first microphone 210a the first microphone 210a is configured by its control unit as being a left channel microphone and as the clock signal is also supplied to the second signal input 103b of the second microphone 210b, the control unit of the second microphone 210 configures the second microphone 210b as being a right channel microphone.

To ensure that the control unit of the first microphone 210a and the control unit of the second microphone 210b identify their microphones as a left channel microphone and a right channel microphone, the central controller 301 can provide the clock signal first (before the data signal) such that the control units of the microphone 210a, 210b can identify their support signal input as being the first signal input 101a of the first microphone 210a and the second signal input 103b of the second microphone 210b.

To summarize, while the microphone arrangement 300 shown in FIG. 3a combines the functionality of a supply voltage input, a channel select input and a data signal input, in the signal inputs 101a, 103a, 101b, 103b, the microphone arrangement 310 shown in FIG. 3b combines the functionality of a clock input, a channel select input and a data signal input in the signal inputs 101a, 103a, 101b, 103b.

Both concepts shown in FIG. 3a and in FIG. 3b have the advantage that it is possible to transmit data from the central controller 301 to the microphones 200a, 200b, 210a, 210b without the need for an extra pin at the microphones 200a, 200b, 210a, 210b when compared to conventional microphones which are not capable of receiving data signals. Furthermore, one additional pin at the central controller 301 is sufficient.

FIG. 4 shows a flow chart of a method 400 for processing signals in a microphone, the microphone comprising a first signal input and a second signal input, according to an embodiment of the present invention.

The method 400 may be performed using one of the microphones or microphone arrangements described above.

The method 400 comprises a step 401 of receiving at one of the first signal input and second signal input a support signal.

Furthermore, the method 400 comprises a step 403 of upon receiving the support signal, processing a signal received at the other of the first signal input and second signal input as an incoming data signal. In other words, the method 400 comprises a step 403 of processing a signal received at the second signal input as an incoming data signal, when the support signal was received at the first signal input and processing the signal received at the first signal input as incoming data signal when the support signal was received at the second signal input.

Furthermore, the method 400 may comprise a step 405 of varying (inside the microphone) at least one parameter of the microphone based on the received (incoming) data signal.

The method 400 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example, a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may, for example, be configured to be transferred via a data communication connection, for example, via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A microphone comprising:
   a first signal input;
   a second signal input; and
   a control unit coupled to the first signal input and the second signal input;
   wherein the control unit is configured to, upon receiving a support signal at one of the first signal input and second signal input, process a signal received at the other of the first signal input and second signal input as an incoming data signal;
   wherein the support signal is a supply voltage signal or a clock signal; and
   wherein the control unit is configured to, upon receiving the support signal at the first signal input, process a signal received at the second signal input as data signal and to, upon receiving the support signal at the second signal input, process a signal received at the first signal input as data signal.

2. The microphone according to claim 1, wherein the control unit is configured to vary a parameter of the microphone in dependence on the received data signal.

3. The microphone according to claim 2, wherein the parameter is at least one of:
   a gain of an amplifier of the microphone,
   a setting of an equalizer, a compressor or a limiter of the microphone; and
   a low power mode setting.

4. A microphone comprising:
   a first signal input;
   a second signal input;
   a control unit coupled to the first signal input and the second signal input;
   wherein the control unit is configured to, upon receiving a support signal at one of the first signal input and second signal input, process a signal received at the other of the first signal input and second signal input as an incoming data signal; and
   a data output for providing a microphone output signal, wherein the control unit is configured to vary a timing of the microphone output signal provided at the data output depending on at which of the first signal input and second signal input the support signal was received.

5. The microphone according to claim 4,
   wherein the control unit is configured to receive a clock signal and to, if the support signal was received at the first signal input, update the microphone output signal with a first type of edge of the clock signal and if the support signal was received at the second signal input update the microphone output signal with a second type of edge of the clock signal; and
   wherein the first type of edge and the second type of edge are contrary.

6. The microphone according to claim 1, wherein the control unit is configured to receive the support signal being a clock signal such that, the signal input at which the support signal is received forms a clock input of the microphone and the other signal input forms a data signal input of the microphone.

7. The microphone according to claim 1, wherein the control unit is configured to receive the support signal being a supply voltage signal for supplying the microphone with power, such that the signal input at which the supply voltage signal is received forms a supply voltage input of the microphone and the other signal input forms a data signal input of the microphone.

8. The microphone according to claim 1, wherein the control unit is configured to, when it receives the support signal at the first signal input, treat the microphone as a left channel microphone and, when it receives the support signal at the second signal input, treat the microphone as a right channel microphone.

9. A microphone comprising:
   a first signal input;
   a second signal input; and
   a control unit coupled to the first signal input and the second signal input;
   wherein the control unit is configured to, upon receiving a support signal at one of the first signal input and second signal input, process a signal received at the other of the first signal input and second signal input as an incoming data signal,
   wherein the control unit is configured to identify the signal input of the first signal input and the second signal input at which a first signal edge occurs as a support signal input at which the support signal is applied.

10. The microphone according to claim 9,
    wherein the control unit is configured to identify further signal edges at the support signal input as signal edges of the support signal; and
    wherein the control unit is further configured to identify signal edges at the other signal input at which the first signal edge did not occur as signal edges of the data signal.

11. The microphone according to claim 1, further comprising:
    a data output; and
    a microphone sensor for providing microphone raw data to the control unit;
    wherein the control unit is configured to provide, based on the microphone raw data, a microphone output signal at the data output.

12. The microphone according to claim 1, further comprising a data output, wherein the microphone is a digital microphone such that the control unit is configured to provide a digital microphone output signal at the data output.

13. A microphone comprising:
    a first signal input;
    a second signal input;
    a control unit coupled to the first signal input and the second signal input; and
    a data output for providing a microphone output signal;
    wherein the control unit is configured to, upon receiving a support signal at the first signal input, process a signal received at the second signal input as data signal and to, upon receiving the support signal at the second signal input, process a signal received at the first signal input as data signal;
    wherein the control unit is configured to vary a parameter of the microphone in dependence on the received data signal;
    wherein the control unit is configured to receive the support signal being a clock signal such that, the signal input at which the support signal is received forms a clock input of the microphone and the other signal input forms a data signal input of the microphone;

wherein the control unit is configured to, when it receives the support signal at the first signal input, treat the microphone as a left channel microphone and, when it receives the support signal at the second signal input, treat the microphone as a right channel microphone; and wherein the control unit is configured to vary a timing of the microphone output signal provided at the data output depending on at which of the first signal input and second signal input the support signal was received.

14. A microphone comprising:
a first signal input;
a second signal input;
a control unit coupled to the first signal input and the second signal input; and
a data output for providing a microphone output signal;
wherein the control unit is configured to, upon receiving a support signal at the first signal input, process a signal received at the second signal input as data signal and to, upon receiving the support signal at the second signal input, process a signal received at the first signal input as data signal;
wherein the control unit is configured to vary a parameter of the microphone in dependence on the received data signal;
wherein the control unit is configured to receive the support signal being a supply voltage signal for supplying the microphone with power, such that the signal input at which the supply voltage signal is received forms a supply voltage input of the microphone and the other signal input forms a data signal input of the microphone;
wherein the control unit is configured to, when it receives the support signal at the first signal input, treat the microphone as a left channel microphone and, when it receives the support signal at the second signal input, treat the microphone as a right channel microphone; and
wherein the control unit is configured to vary a timing of the microphone output signal provided at the data output depending on at which of the first signal input and second signal input the support signal was received.

15. A microphone arrangement, comprising:
a supply voltage source;
a first microphone according to claim 1;
a second microphone according to claim 1; and
a central controller;
wherein the supply voltage source is coupled to the first signal input of the first microphone and to the second signal input of the second microphone for providing a supply voltage signal as the support signal to the first signal input of the first microphone and to the second signal input of the second microphone; and
wherein the central controller is coupled to the second signal input of the first microphone and the first signal input of the second microphone for providing the data signal to the first microphone and the second microphone.

16. The microphone arrangement according to claim 15, wherein the second signal input of the first microphone and the first signal input of the second microphone are coupled to the same terminal of the central controller at which the central controller provides the data signal.

17. A microphone arrangement, comprising:
a first microphone according to claim 1;
a second microphone according to claim 1; and
a central controller comprising a clock output and a data output;
wherein the clock output is coupled to the first signal input of the first microphone and the second signal input of the second microphone for providing a clock signal as the support signal to the first signal input of the first microphone and the second signal input of the second microphone; and
wherein the data output of the central controller is coupled to the second signal input of the first microphone and the first signal input of the second microphone for providing the data signal to the first microphone and the second microphone.

* * * * *